(12) United States Patent
Hichri et al.

(10) Patent No.: US 6,764,873 B2
(45) Date of Patent: Jul. 20, 2004

(54) SEMICONDUCTOR WAFER INCLUDING A LOW DIELECTRIC CONSTANT THERMOSETTING POLYMER FILM AND METHOD OF MAKING SAME

(75) Inventors: Habib Hichri, Wappingers Falls, NY (US); Kelly Malone, Poughkeepsie, NY (US); Arthur Martin, Glenham, NY (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 10/199,287

(22) Filed: Jul. 18, 2002

(65) Prior Publication Data

US 2004/0013887 A1 Jan. 22, 2004

(51) Int. Cl.$^7$ .......................... H01L 51/40; C23C 16/00
(52) U.S. Cl. .............. 438/99; 427/255.28; 427/255.25; 427/430.1
(58) Field of Search ........................ 34/405, 413, 497; 134/4, 902; 438/99; 427/255.25, 255.28, 430.1

(56) References Cited

U.S. PATENT DOCUMENTS

| 5,306,350 A | * | 4/1994 | Hoy et al. ............... 134/22.14 |
| 5,908,510 A | * | 6/1999 | McCullough et al. .......... 134/2 |
| 5,965,679 A | | 10/1999 | Godschalx et al. |
| 6,286,231 B1 | * | 9/2001 | Bergman et al. .............. 34/410 |
| 6,288,188 B1 | | 9/2001 | Godschalx et al. |

OTHER PUBLICATIONS

Peters, Semiconductor Inter. 63–74 (Sep. 1998).

* cited by examiner

*Primary Examiner*—James J. Seidleck
*Assistant Examiner*—Thao Tran
(74) *Attorney, Agent, or Firm*—Scully, Scott, Murphy & Presser; Margaret Pepper

(57) ABSTRACT

A semiconductor wafer provided with a thermosetting porous insulating film, wherein the insulating film is made porous, cured and polymerized on the wafer. The film is characterized by a very low dielectric constant based on its constituency and porosity, the latter property of which is caused by the inclusion of liquid or supercritical carbon dioxide in the polymeric reaction mixture.

3 Claims, No Drawings

SEMICONDUCTOR WAFER INCLUDING A LOW DIELECTRIC CONSTANT THERMOSETTING POLYMER FILM AND METHOD OF MAKING SAME

BACKGROUND OF THE DISCLOSURE

1. Field of the Invention

The present invention is directed to a semiconductor wafer which includes a low dielectric constant thermosetting polymer layer and a method of making same. More specifically, the present invention is directed to a semiconductor wafer which includes a polymeric film layer which is a product of a reaction mixture which includes one or more curable monomers and liquid or supercritical carbon dioxide and a method of making same.

2. Background of the Prior Art

The continuing increase in the speed of integrated circuits disposed on semiconductor wafers and the like is the result of the development of dramatically decreased size integrated circuits on semiconductor wafers. This decreased size of integrated circuits results in thinner spaces between individual devices, elements and topographical features thereon. This decreased thickness between devices, elements and topographical features has put increased demand upon the electrical resistance and capacitance of insulating layers disposed between these devices, elements and topographical features of such integrated circuits. A special concern of this decreased thickness is the increasing number of integrated circuit failures caused by shorts and the like. This development emphasizes the need in the art for new dielectric constant polymeric films useful in insulating new and smaller integrated circuits on semiconductor wafers.

That the art recognizes this need is established by recent developments in this art. For example, Peters, *Semiconductor Inter.*, 63–74 (September, 1998) provides a general background article describing the development of low dielectric constant materials for use in integrated circuits. This article evidences the concern in the art for the need of improved low dielectric constant interlevel insulators.

U.S. Pat. Nos. 5,965,679 and 6,288,188 disclose polyphenylene oligomers and polymers useful as dielectric resins in microelectronic fabrication. These polymers, which may be thermosetting, involve the reaction product of a biscyclopentadienone and a polyfunctional acetylene.

The utilization of liquid and supercritical carbon dioxide in integrated circuit processing is well known in the art. Many applications, utilizing liquid or supercritical carbon dioxide in the processing of integrated circuits disposed on semiconductor wafers are known in the art. However, these processes are typically directed to the removal of debris and the like that result from processing of integrated circuits. For example, U.S. Pat. No. 5,908,510 is directed to the removal of residue from an etched precision surface of a device, such as a semiconductor wafer or the like, by exposing the precision surface to liquid or supercritical carbon dioxide.

Copending U.S. patent application Ser. No. 09/893,104 is directed to a dielectric material and a process of forming the same in which an already formed polymer is contacted with liquid or supercritical carbon dioxide. That disclosure, although a significant advance in the art, is distinguished from a product produced from one or more curable monomers. In the invention of the copending application film quality is controlled during spin-on of the dielectric material. Therefore, porosity control is a strong function of the diffusion parameter of liquid or supercritical carbon dioxide and, optionally, the solvent. Simply stated, physical properties of the film formed in accordance with the invention of the copending application cannot be controlled during polymeric film spin-on and thus are dependent upon the diffusion parameter of the carbon dioxide in the polymeric film.

It is furthermore emphasized that in a preferred embodiment of the copending application, wherein a co-solvent is employed, the solvent acts as a porogen. It is more desirable to employ an optional solvent as a plasticizer, to enhance flow and planarizing capabilities. In this manner a more uniform film, having minimal thickness deviations across the circuit assembly, could be obtained.

BRIEF SUMMARY OF THE INVENTION

A semiconductor wafer, which includes a new low dielectric constant polymeric film and a method for making that wafer which includes a new low dielectric constant polymeric film has now been discovered. The new polymer is one of a class of low dielectric constant polymers recently developed, which dielectric constant is further reduced by introducing pores therein. However, unlike prior art porous polymers, the pores are formed concurrently with the polymerization of the polymer. These pores fill with air, a material having a dielectric constant of 1, further reducing the dielectric constant of the already low dielectric constant in-situ formed porous thermosetting resin.

In accordance with the present invention a semiconductor wafer including a low dielectric constant polymeric film is provided. The polymeric film layer is provided by disposing a composition which comprises one or more monomers, curable upon the application of a radiation source or thermal energy, a solvent for the monomer or monomers, liquid or supercritical carbon dioxide and, optionally, a co-solvent on a semiconductor wafer. The composition of curable monomer(s), liquid or supercritical carbon dioxide and, optionally, a co-solvent is intimately mixed and disposed on the wafer at a temperature in the range of between about 30° C. and about 50° C. and a pressure of at least about 73 atmosphere. The temperature of the composition is thereupon incrementally raised to at least about 450° C. followed by incremental temperature reduction to ambient temperature. The pressure, which is maintained at at least about 73 atmospheres during initial temperature elevation, is reduced when a temperature of at least about 310° C., more preferably, between about 310° C. and about 400° C., is reached. The exact temperature is a function of the desired pore size distribution of the product film. When this temperature is reached, pressure is reduced incrementally to atmospheric pressure.

In further accordance with the present invention a process is provided for the preparation of a semiconductor wafer which includes a low dielectric constant polymeric film. This process includes the steps of combining at least one curable monomer and liquid or supercritical carbon dioxide at a temperature in the range of between about 30° C. and about 50° C. and at a pressure of at least about 73 atmospheres. The temperature of the thus formed composition is thereupon incrementally raised to at least about 450° C. and then incrementally reduced to ambient temperature. The pressure is maintained at at least about 73 atmospheres until the temperature, which is incrementally advanced, reaches at least about 310° C. The pressure is thereupon incrementally reduced to atmospheric pressure.

DETAILED DESCRIPTION

A new semiconductor wafer, which includes a low dielectric constant polymeric film, is produced in which that film is prepared by combining at least one curable monomer, a solvent therefor, liquid or supercritical carbon dioxide and, optionally, a co-solvent under thermodynamic conditions consistent with the maintenance of the liquid or supercritical carbon dioxide in that state. Thus, at least one curable monomer is combined with liquid or supercritical carbon dioxide at a temperature in the range of between about 30° C. and about 50° C. and a pressure of at least about 73 atmospheres. More preferably, the one or more curable monomers and liquid or supercritical carbon dioxide are combined at a temperature in the range of between about 35° C. and about 40° C. and a pressure in the range of between about 75 atmospheres and about 80 atmospheres. The one or more curable monomers and the liquid or supercritical carbon dioxide are intimately mixed, under these thermodynamic conditions, until a uniform product is obtained. In the case where a co-solvent is used, the aforementioned treatment extends to the inclusion of the co-solvent.

The thus formed, intimately mixed reaction mixture is thereupon subjected to incremental increasing temperature until a temperature of about 450° C. is reached. Thereupon, the temperature of the mixture is incrementally reduced to ambient temperature, e.g. about 25° C. At the same time that the temperature is increased, the pressure is not reduced until a temperature of between about 310° C. and 400° C. is reached whereupon the pressure is incrementally reduced to atmospheric pressure. More preferably, the maximum temperature reached before pressure is reduced is about 400° C.

In a more preferred embodiment of the present invention a reaction mixture of at least one curable monomer, liquid or supercritical carbon dioxide and, optionally, a co-solvent is combined at a temperature in the range of between about 35° C. and about 40° C. and a pressure in the range of about 75 atmospheres and about 80 atmospheres.

The steps of temperature increase occur at a rate in the range of between about 15° C. and about 40° C. per minute until a temperature of at least about 200° C. is reached. More preferably, this rate of increase is about 25° C. per minute. When a temperature of about 200° C. is reached, the rate of temperature increase is reduced to a rate of increase of between about 10° C. and about 35° C. per minute until a temperature of about 400° C. is reached. More preferably, temperature increases at a rate of between about 20° C. when increasing from about 200° C. to about 400° C. Temperature increase from about 400° C. to about 450° C. occurs at a rate of increase of between about between about 3° C. and about 10° C. per minute. More preferably, this rate of temperature increase is about 5° C. per minute.

The above described temperature increase is subject to certain preferred temperature control procedures. That is, in optional preferred embodiments, temperature increase is stopped for certain time durations. Thus, when the temperature is raised to about 100° C., that temperature remains fixed for a duration of between about 30 seconds and about 120 seconds. More preferably, that duration of fixed temperature is between about 90 seconds and about 120 seconds. An identical hold in temperature preferably occurs at about 200° C., at about 310° C. and at about 400° C.

As stated above, the initial pressure is maintained at at least about 73 atmospheres to insure maintenance of the carbon dioxide in the liquid or supercritical state. This pressure, preferably between about 75 atmospheres and about 80 atmospheres, is maintained at the initial pressure of at least about 73 atmospheres until the temperature reaches about 310° C., more preferably about 400° C., at which point pressure is reduced. Pressure reduction occurs at a rate in the range of between about 0.1 atmosphere/second and about 2 atmospheres/second until atmospheric pressure is reached.

It is apparent from the above processing conditions that initial pressure reduction is accompanied by increasing temperature. That is, although temperature, upon reaching a minimum of 310° C., more preferably, about 400° C., is further increased, until a temperature of about 450° C. is obtained, pressure is decreased. When the temperature reaches about 450° C., the temperature of the reaction mixture is reduced, at a rate of between about 10° C. per minute and about 35° C. per minute, more preferably, about 25° C. per minute, until ambient temperature, e.g. about 25° C., is reached.

The aforementioned thermodynamic conditions are designed to permit curing of the monomer or monomers coincident with the formation of pores. These thermodynamic conditions are additionally consistent with the maintenance of carbon dioxide in the liquid or supercritical state prior to curing of the thermosetting polymer.

An apparatus that may be used to practice the aforementioned process is set forth in the apparatus disclosed in U.S. Pat. No. 5,908,510, incorporated herein by reference. Of course, other systems, devices, apparatus and tools which insure the maintenance of carbon dioxide in the liquid or supercritical state, by the maintenance of thermodynamic condition consistent with such carbon dioxide state, may be alternatively employed.

The curable monomer or monomers of the reaction mixture utilized in the formation of the thermosetting polymer of the present invention includes unsaturated aryl ethers, arylenes, phenylethynyls, organosiloxanes, imides, organosilozanes, hydroxyarylenes, paralenes and the like. Of these, monomers phenylethynyls and amides are particularly preferred.

The monomer is provided in a solution. Thus, the third component of the composition is a solvent which dissolves the monomer. The solvent may be polar or apolar. Apolar solvents within the contemplation of the composition of the present invention are hydrocarbon solvents such as mesitylene, heptane, hexane, cyclopentane, cyclohexane an the like. Polar solvents useful employed in the composition include lactones, such as δ-butyrolatone, ketones, such as cyclohexanone, and aldehydes, such as butanal. Of the solvents employed in the composition, polar solvents are preferred.

An optional component of the reaction mixture, in addition to the curable monomers, liquid or supercritical carbon dioxide and a solvent, is a co-solvent. In the preferred embodiment wherein a co-solvent is included in the monomeric composition, the solvent is preferably a low molecular weight compound which does not reactant with any species with which it is in contact. Particularly preferred co-solvents are alcohols having the structural formula ROH, where R is $C_4$–$C_{10}$ alkyl or $C_5$–$C_7$ cycloalkyl. Of those alcohols, butanol, pentanol, cyclopentanol and cyclohexanol are particularly preferred.

The composition, which produces the polymeric reaction product, includes between about 5% and about 25% monomer; between about 30% and about 40% solvent; between about 25% and about 65% liquid or supercritical carbon dioxide; and between 0 and about 20% co-solvent. Preferably, the composition includes between about 5% and about 15% monomer; between about 35% and about 40% solvent; between about 40% and about 53% liquid or supercritical carbon dioxide; and between about 2% and about 10% co-solvent, all percentages being by weight, based on the total weight of the composition.

The following example is given to illustrate the present invention. Because this example is given for illustrative purposes only, the invention should not be deemed limited thereto.

EXAMPLE

A mixture of phenylethynyl, cyclohexanol and δ-butyrolactone is disposed on a semiconductor wafer in a chamber equipped to satisfy the thermodynamic conditions to which the reaction mixture must be exposed to maintain carbon dioxide in the supercritical state. Thereupon, supercritical carbon dioxide is introduced into the chamber, which is maintained at a temperature of between 30° C. and 35° C. The pressure, provided by the partial pressure of the supercritical carbon dioxide, is maintained at about 75 atmospheres The resultant reaction mixture of monomer and supercritical carbon dioxide are spun together to form a composition. The chamber temperature is thereupon raised, at a rate of 25° C. per minute, until a temperature of 100° C. is reached. When a temperature of 100° C. is attained, that temperature is maintained constant for 90 to 120 seconds. The temperature is thereupon again raised, again at an increasing rate of 25° C. per minute, until a temperature of 200° C. is reached. Again, upon reaching a temperature of 200° C., that temperature is held constant for 90 to 120 seconds.

The temperature is thereupon again increased, now at a rate of 20° C. per minute, until a temperature of 310° C. is reached. Upon reaching 310° C., the temperature is held constant for 30 to 120 seconds. Thereupon the temperature is raised again at a rate of 20° C. per minute to a temperature of 400° C. and again held at that temperature for 30 to 120 seconds.

The temperature is thereupon increased to 450° C. at a decreased increasing rate of 5° C. per minute. This final temperature raise from 400° C. to 450° C. is accompanied by a decrease in pressure of 2 atmospherics/second.

When the temperature reaches 450° C., the temperature is decreased at a rate of 25° C. per minute. The rate of pressure reduction, begun when a temperature of 400° C. is first reached, is maintained during the temperature reduction step until ambient temperature and pressure conditions are reached.

The above embodiments and examples are given to illustrate the scope and spirit of the present invention. These embodiments and examples will make apparent other embodiments and examples. These other embodiments and examples are within the contemplation of the present invention. Therefore, the present invention should be limited only by the appended claims.

What is claimed is:

1. A process for making a semiconductor wafer comprising the steps of:
   (a) disposing at least one curable monomer and a solvent therefor upon a semiconductor wafer in a thermodynamically controllable chamber;
   (b) introducing liquid or supercritical carbon dioxide into said curable monomer at a temperature in the range of between about 30° C. and about 50° C. and at a pressure of at least about 73 atmospheres, whereby a composition of a reaction mixture is formed;
   (c) incrementally increasing said temperature of step (b) until a temperature of about 450° C. is reached;
   (d) incrementally reducing said temperature of step (c) until an ambient temperature is reached;
   (e) not reducing said pressure during said temperature raise in step (c) until a temperature of between about 310° C. and about 400° C. is reached; and
   (f) thereafter incrementally decreasing said pressure to atmospheric pressure.

2. A process in accordance with claim 1 wherein a co-solvent is disposed on said wafer in step (a); said liquid or supercritical carbon dioxide is introduced at a temperature of between about 35° C. and about 40° C. and at a pressure of between about 75 atmospheres and about 80 atmospheres in step (b); and said pressure is not reduced in step (e) until a temperature of about 400° C. is reached.

3. A process in accordance with claim 1 wherein said step (c) comprises increasing said temperature of step (b) at a rate of between about 15° C. and 40° C. per minute until a temperature of at least about 200° C. is reached; at a rate of between about 10° C. and about 35° C. per minute until a temperature of about 400° C. is reached; and at rate of between about 3° C. and about 10° C. per minute until a temperature of about 450° is reached.

* * * * *